United States Patent
Koroki et al.

(10) Patent No.: US 9,987,710 B2
(45) Date of Patent: *Jun. 5, 2018

(54) SOLDER PASTE

(71) Applicant: Senju Metal Industry Co., Ltd., Tokyo (JP)

(72) Inventors: Motoki Koroki, Tokyo (JP); Shunsaku Yoshikawa, Tokyo (JP); Sakie Okada, Tokyo (JP); Taro Itoyama, Tokyo (JP); Hideyuki Komuro, Tokyo (JP); Naoko Hirai, Tokyo (JP); Keitaro Shimizu, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 14/783,230

(22) PCT Filed: Mar. 28, 2014

(86) PCT No.: PCT/JP2014/059195
§ 371 (c)(1),
(2) Date: Jan. 11, 2016

(87) PCT Pub. No.: WO2014/168026
PCT Pub. Date: Oct. 16, 2014

(65) Prior Publication Data
US 2016/0158896 A1 Jun. 9, 2016

(30) Foreign Application Priority Data

Apr. 9, 2013 (JP) ................ 2013-081000

(51) Int. Cl.
| | |
|---|---|
| *B23K 35/26* | (2006.01) |
| *B23K 35/362* | (2006.01) |
| *C22C 9/02* | (2006.01) |
| *H05K 1/09* | (2006.01) |
| *C22C 13/00* | (2006.01) |
| *C22C 13/02* | (2006.01) |
| *B22F 1/00* | (2006.01) |
| *H05K 1/02* | (2006.01) |
| *B23K 35/02* | (2006.01) |
| *C22C 12/00* | (2006.01) |
| *B23K 35/22* | (2006.01) |
| *B23K 35/30* | (2006.01) |

(52) U.S. Cl.
CPC .......... *B23K 35/262* (2013.01); *B22F 1/0059* (2013.01); *B23K 35/025* (2013.01); *B23K 35/0222* (2013.01); *B23K 35/0244* (2013.01); *B23K 35/22* (2013.01); *B23K 35/26* (2013.01); *B23K 35/302* (2013.01); *B23K 35/362* (2013.01); *C22C 9/02* (2013.01); *C22C 12/00* (2013.01); *C22C 13/00* (2013.01); *C22C 13/02* (2013.01); *H05K 1/0298* (2013.01); *H05K 1/09* (2013.01); *B22F 2301/10* (2013.01); *B22F 2301/30* (2013.01); *B22F 2302/45* (2013.01); *B22F 2304/10* (2013.01)

(58) Field of Classification Search
CPC ........ H05K 1/09; H05K 1/0298; H05K 1/092; B23K 35/262; B23K 35/362; B22F 1/0059

USPC .......................................... 174/257
See application file for complete search history.

(56) References Cited

U.S. PATENT DOCUMENTS

| | | | | |
|---|---|---|---|---|
| 5,520,752 | A | * | 5/1996 | Lucey, Jr. ............ B23K 35/262 148/400 |
| 7,259,465 | B2 | | 8/2007 | Soga et al. |
| 8,388,724 | B2 | | 3/2013 | Kato et al. |
| 2002/0100986 | A1 | | 8/2002 | Soga et al. |
| 2002/0114726 | A1 | | 8/2002 | Soga et al. |
| 2009/0220812 | A1 | | 9/2009 | Kato et al. |
| 2009/0301607 | A1 | * | 12/2009 | Nakano ............ B23K 35/0244 148/24 |
| 2010/0291399 | A1 | * | 11/2010 | Kato ................... B23K 35/025 428/553 |
| 2012/0031649 | A1 | * | 2/2012 | Antesberger ........ H05K 3/4069 174/251 |
| 2012/0119392 | A1 | | 5/2012 | Breer et al. |
| 2013/0299219 | A1 | * | 11/2013 | Chisaka ............. H05K 1/0271 174/257 |

FOREIGN PATENT DOCUMENTS

| | | |
|---|---|---|
| CN | 101479073 A | 7/2009 |
| JP | 9122967 A | 5/1997 |
| JP | 2002124533 A | 4/2002 |
| JP | 2002280396 A | 9/2002 |
| JP | 2002280936 A | 9/2002 |
| JP | 2003245793 A | 9/2003 |
| JP | 2003311469 A | 11/2003 |
| JP | 3558063 B2 | 5/2004 |
| JP | 201162736 A | 3/2011 |
| JP | 2011166115 A | 8/2011 |
| JP | 2012533435 A | 12/2012 |
| WO | 2007125861 A1 | 11/2007 |
| WO | 2008026761 A1 | 3/2008 |

OTHER PUBLICATIONS

Heraeus; "Technical Data Sheet: Lead free Solder Paste Series F640: No Clean Solder Pastes with excellent wetting"; pp. 1-3.

* cited by examiner

*Primary Examiner* — Hoa C Nguyen
*Assistant Examiner* — Amol Patel
(74) *Attorney, Agent, or Firm* — The Webb Law Firm

(57) ABSTRACT

A solder paste whereby metal does not flow out of a joint during a second or subsequent reflow heating stage. The solder paste excels in terms of temporal stability and exhibits high joint strength at room temperature and at high temperatures. The solder paste comprises a powdered metal component and a flux component, the powdered metal component comprising: 10-70 mass % of a powdered intermetallic compound comprising copper and tin and 30-90 mass % of a solder powder including tin as a main component. Neither the powdered intermetallic compound nor the solder powder contains a copper-only phase, inhibiting the elution of copper ions into the flux.

8 Claims, No Drawings ized Cu is reduced by the organic acids or
SOLDER PASTE

CROSS-REFERENCE TO RELATED APPLICATIONS

This application is the United States national phase of International Application No. PCT/JP2014/059195 filed Mar. 28, 2014, and claims priority to Japanese Patent Application No. 2013-081000 filed Apr. 9, 2013, the disclosures of which are hereby incorporated in their entirety by reference.

TECHNICAL FIELD

The present invention relates to a solder paste used for joining substrates.

BACKGROUND ART

As use of mobile electronic instruments for consumer use, such as laptop personal computers and mobile phones, has become widespread, requirements of the miniaturization and the improved performance of such instruments are increased. In order to meet the requirements, recently, laminated substrates, in which multiple printed wiring boards are laminated, have been used, in addition to the densification of the printed wiring board.

The laminated substrate is a substrate obtained by electrically joining substrates in a manner in which filling a material for joining such as solder in via holes provided in each substrate and pressurizing the substrates while heating them. When the number of laminates of the substrate is three or more, if a joint, which has been formed from the material for joining when a first layer and a second layer are joined (on a first reflow), is melted and flows out of the joint when the resulting layers are joined to a third layer (on a second reflow), defects such as short circuit of connection are caused.

Even if the metal does not flow out, if the joint, which has been formed on the first reflow, is melted on the second reflow, defects may be caused, for example, the joint is damaged and the substrate is out of position. For that reason, materials for joining, which can form a joint having a certain level of joint strength as well as do not flow out on the second reflow are required. Then, materials for joining capable of providing a joint formed on the first reflow, which does not re-melted on the second reflow by heating the material for joining to a high temperature (making the material to have a high melting point) during the first reflow process, are used.

For example, when both of a heating temperature in the first reflow and a heating temperature in the second reflow are the same 250° C. to 270° C., the material for joining, which joints the first layer to the second layer, may be melted, but it is required for the joint, which has been formed in the first reflow, not to be melted at a temperature of 270° C., which is the highest temperature in the second reflow.

As such a material for joining having a high re-melting temperature, Patent Literature 1 discloses a solder paste obtained by mixing Cu balls with Sn balls in a flux. At a temperature equal to or higher than a melting point of Sn, the solder paste forms a compound including $Cu_6Sn_5$ from a part of the Cu balls and the Sn balls, and the Cu balls are bonded to each other through the compound including $Cu_6Sn_5$, and thus the re-melting temperature thereof is increased. According to this invention, when the Sn balls are fused, Sn is wetly spread on the Cu balls, fills spaces between the Cu balls, and exists comparatively uniformly between the Cu balls, whereby the $Cu_6Sn_5$ having a melting point of 400° C. or higher is formed on at least a part of the surfaces of the Cu balls, and the Cu balls are bonded to each other through the $Cu_6Sn_5$.

Patent Literatures 2 and 3 disclose that an intermetallic compound powder is previously added to a solder paste, and, at the same time, it is essential to add a copper fine powder

CITATIONS LIST

Patent Literature 1: JP-B-3558063
Patent Literature 2: JP-A-2011-62736
Patent Literature 3: Japanese Translation of PCT International Application Publication No. 2012-533435
Patent Literature 4: JP-A-09-122967
Patent Literature 5: JP-A-2002-124533
Patent Literature 6: WO 2007/125861

SUMMARY OF INVENTION

The solder pastes disclosed in Patent Literatures 1, 2 and 3, however, cause time-dependent change in a storage period of about 3 months and viscosities thereof are increased. In general, a mechanism of causing the time-dependent change of the solder paste is that metal elements in a metal powder are eluted as metal ions by organic acids or activators in a flux, and the metal ions are reacted with the organic acid or activators in the flux to produce metal salts.

The solder pastes disclosed in Patent Literatures 1, 2 and 3 are added with Sn and Cu as metal powders, but, in particular, oxidized Cu is reduced by the organic acids or activators in the flux to form Cu ions, followed by reaction with rosin or the organic acids to form Cu metal salts. The metal salts as generated above may increase the viscosity of the solder paste, may reduce temporal stability, which means printability or storability, and may possibly cause short circuit of connection between wirings, when the metal salts remain in a substrate as a residue together with volatile component of the solder paste.

In order to improve the temporal stability of the solder paste, it can be considered to select the rosin or additives, which are contained in the solder paste, which have a weak activity. It can be considered, however, this narrows room for selection of the rosin and additives and, in some cases, wettability is remarkably reduced due to the reduced activity.

In association with the recent miniaturization of electronic instruments, the densification of a mounting technology and the miniaturization of connection terminals of a printed wiring board are also advanced. For that reason, an area where the solder paste is printed becomes minute, and an interval between the adjacent the areas is narrowed, and thus it is required for a solder paste, which is printed on a connection terminal, to have excellent printability.

As described above, even if the Cu ball-containing solder paste may be stored in a sealed container after the preparation, the time-dependent change is caused in a storage period of about 3 months, and the viscosity thereof is increased. In addition, when the container, in which the solder paste is stored, is opened and it is used for soldering, the time-dependent change of the solder paste in the container is advanced and the viscosity is increased in about half a day.

As stated above, the solder paste containing the Cu balls cannot avoid the time-dependent change during the storage and in use.

Considering that a 6 month-warranty period is given to a conventional, generally used solder paste, it is desirable to give a 3 or more month-warranty period even to the solder paste containing the Cu balls.

In particular, the problem of the time-dependent change during the storage period becomes evident in the solder paste which is now used in a fine circuit, i.e., a pore size of a metal mask is decreased to about 200 µm or less, and solder particles having a particle size of 25 to 38 µm, which is finer than that of the particles conventionally used, are necessary. For that reason, the surface area of the whole solder particle is larger, which seems to greatly influence to the time-dependent change of the solder paste.

It is required, accordingly, for the solder paste, which has recently been used, to have, in addition to the storability in which the solder paste does not cause the time-dependent change even if it is stored for a long period of time after the preparation, the excellent printing stability in which the viscosity of the solder paste is not increased and the solder paste can be continuously used even if it is exposed to an oxidative atmosphere upon the printing, in order words, the temporal stability in which the continuous printability can be exerted and the continuous printability can be kept for a long period of time. In the instant specification, the stabilities described above may be collectively referred to as simply "temporal stability."

In order to cope with the recent miniaturization of electronic instruments, the present invention aims at providing a solder paste having a high joint strength in which a joint, which has been formed in a first reflow, does not flow out particularly during a second or subsequent reflow of a laminated substrate and which is equal to or higher than that of a solder paste having Cu balls even at a normal temperature (25° C.) and at a high temperature (250° C.), and a temporal stability which is as good as or better than that of a generally-used solder paste containing no Cu balls.

The present inventors have focused on metal powders in the solder paste rather than components of the flux, to prevent the formation of metal salts of Cu caused by the elution of Cu ions into the flux. Specifically, they have focused on the addition of, as a metal powder to be added to the solder paste, a Cu—Sn intermetallic compound powder, which is an intermetallic compound obtained by previously reacting Cu with Sn, to the solder paste, instead of the addition of a Cu powder. As a result, the present inventors have obtained an idea in which the addition of the "intermetallic compound powder containing Cu and Sn" which obtained by previously reacting Cu with Sn, instead of the "Cu powder," to the solder paste can suppress the elution of Cu ions, because Cu does not exist in the material for joining alone.

According to the present invention, therefore, a mixture of an Sn base solder powder and an intermetallic compound powder is added to a flux to form a solder paste. It has been conventionally considered that the intermetallic compound has poor wettability, and thus even if the intermetallic compound is formed into a powder and it is added to the solder paste, a joint having the sufficient joint strength cannot be obtained.

In the present invention, however, soldering is performed at a heating temperature of 250 to 270° C. in the second or subsequent reflow, and thus the poor wettability is not disadvantage. Instead, it is more difficult to oxidize the intermetallic compound powder containing Cu and Sn than the Cu powder, and thus the wettability to the substrate is better than that of the Cu powder when it is formed into a paste. In this regard, it has been unexpectedly found that there is an advantage of a small time-dependent change when the intermetallic compound is formed into a solder paste, because it has a nature in which it is difficult to oxidize the intermetallic compound even if the compound is powdered to have a large surface area, i.e., it is difficult to form oxides on the surface thereof. In addition, when the intermetallic compound powder is formed into a solder paste, effects of the flux can be greatly exhibited, because it is difficult to form the oxides on the surface, compared to the Cu powder and the Sn powder, and thus the wettability is remarkably improved. When the intermetallic compound powder, which has been primarily considered to have the poor wettability, is used for the solder paste, the wettability thereof can be improved, which is an unexpected effect.

It has been conventionally proposed to add a small amount of an intermetallic compound to a solder paste, as shown in Patent Literatures 4 and 5, but they aim at improving strength at a normal temperature but they do not aim at increasing a melting temperature of a joint. In this regard, Patent Literature 6 discloses a material of increasing the melting point of the joint, but the material is a Cu powder plated with Ni, and thus the material is different from the solder past of the present invention in a composition.

The present invention is as follows:

(1) A solder paste containing a metal powder component and a flux component, wherein the metal powder component contains an intermetallic compound powder including Cu and Sn, and a solder powder including as a main component Sn, and the metal powder component contains 10 to 70% by mass of the intermetallic compound powder and 30 to 90% by mass of the solder powder.

Here, in the present invention, the "intermetallic compound" refers to a compound obtained by bonding Cu and Sn in a pre-determined integer ratio.

(2) The solder paste according to (1), wherein the metal powder component has an average particle size of 50 µm or less.

(3) The solder paste according to (1) or (2), wherein the solder powder has the Sn in a content of 40 to 100% by mass.

(4) The solder paste according to any one of (1) to (3), wherein the solder powder is a mixture containing two or more kinds of solder powders having a composition different from each other.

(5) A solder joint formed using the solder paste according to any one of (1) to (4).

DESCRIPTION OF THE INVENTION

The solder paste according to the present invention contains a metal powder component containing an intermetallic compound powder containing Cu and Sn, and a solder powder containing, as a main component, Sn. The metal powder component does not contain a Cu single phase component.

First, the intermetallic compound containing Cu and Sn does not contain the Cu single phase forming cubic crystals. The intermetallic compound containing Cu and Sn forms hexagonal crystals of Cu and Sn, and thus Cu atoms comparatively stably exist in the intermetallic compound.

In addition, it is generally known that, for the existence of the Cu single phase, it is necessary that 90% by mass or more of Cu exists in the intermetallic compound or solder alloy at a normal temperature. Even if the solder powder containing, as a main component, Sn contains Cu, the Cu content is at most less than 60%, and thus the solder powder does not contain the Cu single phase but Cu exists as the intermetallic compound of Sn and Cu, which is the hexagonal crystal. The solder powder used in the present invention, accordingly, has a formation more stable than the Cu single phase, which is the cubic crystal.

The Cu contained in the intermetallic compound powder and the solder powder forming the solder paste of the present invention can remain more stable than Cu in the Cu single phase. In the solder paste according to the present invention, accordingly, only a very small amount of Cu ions are eluted into the material for joining, and thus metal salts of Cu, which are formed by the reaction of Cu with flux components, are hardly formed, and the solder paste has the excellent temporal stability.

When a joint is formed from the solder paste according to the present invention and a connection terminal of the substrate, the intermetallic compound powder containing Cu and Sn is reacted with Sn in the solder powder, whereby network structures of the intermetallic compound are formed between the intermetallic compound powders and between the intermetallic compound powder and the connection terminal. The Sn in the solder powder forms newly network structures of $Cu_6Sn_5$, whereby the joint strength at a high temperature is increased. As a result, in the joint formed using the solder paste according to the present invention, the metals are not eluted from the joint on second and subsequent reflow heating stages, because of the high melting point of the intermetallic compound formed, and the joint having the high joint strength can be formed.

Furthermore, rosin and additives, which have the strong activity and thus have conventionally not been able to be used due to the problem of the temporal stability, can be used, and the wettability of the solder paste is improved and the formation of network structures by formation of the new intermetallic compound is promoted; as a results, the further improvement of the joint strength can be expected.

Next, the intermetallic compound powder and the solder powder, forming the solder paste according to the present invention, are explained.

Intermetallic Compound Powder

The intermetallic compound powder, used in the solder paste according to the present invention, contains Cu and Sn, but contains no Cu single phase, because Cu and Sn form the intermetallic compound, whereby the elution of Cu ions into the flux in the solder paste hardly occurs, and thus the solder paste has the excellent temporal stability.

In the present invention, the intermetallic compound is contained in a content of 10 to 70% by mass relative to the metal powder component, preferably 15 to 65% by mass, more preferably 20 to 50% by mass.

In the joint formed using the solder paste according to the present invention, network structures of the intermetallic compound are formed by heating during reflow. The intermetallic compound has generally a high melting point, and when the solder paste according to the present invention is used for joining a first layer of a substrate to a second layer of the substrate, metals do not flow out from the joint at a temperature of 250° C. to 270° C., which is a temperature at which a third and subsequent layers of the substrate are joined, that is, the high joint strength can be obtained.

In order to stably contain Cu in the powder, a mass ratio of Sn to Cu in the intermetallic compound powder is within a range of preferably 8:2 to 1:9, more preferably 7:3 to 2:8, particularly preferably 6:4 to 3:7, most preferably 6:4 to 4:6. The intermetallic compound formed in this mass ratio may include, for example, $Cu_3Sn$ and $Cu_6Sn_5$. They show a melting point of 400° C. or higher, and thus if the joint is formed from the intermetallic compounds, the re-melting temperature is increased, and it can be used on the assumption that the joint is heated multiple times.

The solder paste according to the present invention contains preferably $Cu_3Sn$ as the intermetallic compound. This is because if the solder paste contains $Cu_3Sn$, Sn in the solder is reacted with $Cu_3Sn$ in the intermetallic compound powder during the formation of the solder joint by reflow, a part of $Cu_3Sn$ is changed to $Cu_6Sn_5$, the newly formed $Cu_6Sn_5$ forms network structures of $Cu_6Sn_5$ between the intermetallic compound powder particles, which have been previously added, and between the connection terminal and the intermetallic compound powder.

A content ratio of $Cu_3Sn$ to $Cu_6Sn_5$ in the solder joint formed from the solder paste of the present invention is preferably from 48:1 to 13:33. When the content is within the range described above, the joint shows the high joint strength.

The "content ratio of $Cu_3Sn$ to $Cu_6Sn_5$" in the present invention refers to a content ratio of $Cu_3Sn$ to $Cu_6Sn_5$, relative to the whole intermetallic compound.

The intermetallic compound powder has preferably an average particle size of 50 μm or less for the use of the solder paste. The present invention, however, is proposed to solve the problem, i.e., to suppress the time-dependent change, which occurs when a conventional solder paste is powdered into a fine powder, as stated above, and considering a case where the solder paste is used for soldering for a fine structure, the average particle size is preferably 40 μm or less, more preferably 30 μm or less. The lower limit thereof is not limited. The particle size is generally 0.1 μm or more (D=50% value), for manufacturing reasons.

In the present invention, the surface of the intermetallic compound powder may be coated with a metal plating containing one or more kinds of metal elements other than Cu. When the intermetallic compound powder is coated with the metal plating on its surface, the reaction of the solder powder with the intermetallic compound powder before melting of the solder powder can be prevented, whereby void formation in the solder joint can be suppressed, a cohesion ratio can be improved, and the temporal stability can be remarkably improved.

Materials of plating the intermetallic compound powder may include Sn, Ni, and the like, which are metal elements other than Cu.

The metal plating can be formed in a conventionally well-known method such as electroplating or electroless plating. The film thickness of the metal plating is not particularly limited, and it is generally from 0.01 to 10 μm, preferably from 0.1 to 3 μm.

Solder Powder

The solder powder, used in the present invention, is used for joining the connection terminal of the substrate to the intermetallic compound powder, or joining the intermetallic compound powder particles to each other.

In the present invention, a ratio of the solder powder containing, as a main component, Sn to the metal powder component is from 30 to 90% by mass, preferably from 40 to 85% by mass, more preferably from 50 to 80% by mass.

In the present invention, the phrase "containing, as a main component, Sn" refers to an Sn content in the solder powder of 40 to 100% by mass. The reason that the solder powder containing, as a main component, Sn is used is a material used for a connection terminal of a substrate is generally Cu, and the network structures of the intermetallic compound between the intermetallic compound powder, used in the present invention, and the connection terminal. When the Sn content is from 40 to 100% by mass, the Cu single phase does not exist, even if the alloy composition of the solder powder contains Cu.

Here, in the present invention, the "solder" refers to a metal or alloy used for joining materials to each other, which can be subject to reflow at a peak temperature of 270° C. or lower on the mounting.

The solder powder has a composition including Sn, Sn—Ag—Cu, Sn—Bi, Sn—In, Sn—Ag, Sn—Cu, Sn—Sb, Sn—Ni, and the like. Each of the compositions described above may contain one or more elements selected from Ag, Cu, Bi, In, Ni, Co, Sb, Ge, Ga, P, Fe, Zn, Al, and Ti, excluding the elements which are already added, in a content of each element of 5% by mass or less, in order to improve the strength and wettability.

Further, the solder powder may be coated on its surface with one or more layers containing at least one metal or alloy selected from Sn, Ag, Cu, Bi, In, Ni, Co, Sb, Ge, Ga, P, Fe, Zn, Al, and Ti, provided that the layers have a composition different from that of the solder powder and do not contain Cu alone.

As the solder powder, forming the solder paste of the present invention, a mixture of two or more kinds of solder powders may be used which have a different composition or different particle size from each other.

The solder powder, used as the solder paste, has an average particle size of 50 μm or less. In the present invention, the particle size of the solder powder is the same as the conventional one as above, and is not particularly limited. The lower limit of the particle size is now about 0.1 μm (D=50% value), for the manufacturing reasons.

When the intermetallic compound powder in the present invention contains at least one of $Cu_3Sn$ and $Cu_6Sn_5$ and the intermetallic compound powder satisfies the content ratio described above, the content ratio of the Sn content in the solder paste according to the present invention to the total of the $Cu_3Sn$ content and the $Cu_6Sn_5$ content preferably satisfies the following formula.

(Sn Content)/(Total Content of $Cu_3Sn$ Content and $Cu_6Sn_5$ Content)≥1/10      Formula When the joint is formed using the material for joining satisfying the formula described above, the joint strength at a high temperature is increased.

In the present invention, a low α-ray material for joining is obtained by using a low α-ray materials as the solder powder or the intermetallic compound powder. When such a material for joining is used for joining in a memory peripheral circuit, soft errors can be prevented.

The flux used in the present invention is not particularly limited so long as it is generally used for the solder paste. A flux obtained by suitably blending rosin, organic acid, activators and a solvent, which are generally used, may be used. In the present invention, Cu is not contained alone and the temporal stability is not impaired by the elution of Cu ions, and thus advantageously the active component in the flux may be used in an amount larger than usual, or an activator stronger than generally used activator may be used.

In the present invention, a blending ratio of the metal powder to the flux component is not particularly limited, and it is preferably 80 to 90% by mass of the metal powder component of and 10 to 20% by mass of the flux component.

The thus prepared solder paste according to the present invention can be subjected to reflow, for example, by a printing method, a discharging method using a dispenser, or a transferring method using transfer pins, to stick it to a portion to be soldered of a circuit substrate having a fine structure. In that case, the temporal stability equal to or higher than that of the generally used solder paste including neither Cu balls nor Cu powder can be realized.

In the present invention, the soldering temperature, i.e., the reflow temperature is not particularly limited, and there are no problems in particular when the soldering can be performed, for example, at a temperature of 250 to 270° C.

EXAMPLES

Solder pastes of Examples containing a solder powder and an intermetallic compound powder and having composition ratios shown in Table 1, and solder pastes of Comparative Examples containing a solder powder, and arbitrarily an intermetallic compound powder and a Cu powder shown in Table 1 were prepared. With respect to each solder paste, the joint strength at a normal temperature or a high temperature, the color of an outside appearance of the soldered portion, and the temporal stability, evaluated by the viscosity change, were investigated. In Examples and Comparative Examples, the blending ratio of the metal powder component and the flux component was 88% by mass of the metal powder component and 12% by mass of the flux component. However, in Comparative Example 4, the metal powder component content was 80% by mass and the flux component content was 20% by mass.

In Examples, the method for producing the solder paste and the evaluation method of each property were as follows:
Method for Producing Solder Paste The solder pastes in Examples were produced as follows: First, an Sn powder (solder powder) having an average particle size of 20 μm, a solder powder containing, as a main component, of Sn, and an intermetallic compound powder containing Cu and Sn in which a content of Sn having an average particle size of 20 μm is suitably adjusted in a range of 23 to 68% by mass relative to Cu, were prepared in amounts so that the ratios shown in Table 1 were satisfied. The metal powders were immersed in a pasty rosin flux, SDC5 (a trademark) manufactured by Senju Metal Industry Co., Ltd., the mixture was kneaded to produce the solder paste of Example. The content of the flux was adjusted to 12% by mass relative to the whole mass of the solder paste.

The pastes of Comparative Examples were produced in the same manner as in the production of the solder paste of Example, except that, in Comparative Example 3, a Cu powder having an average particle size of 7.5 μm, manufactured by Fukuda Metal Foil & Powder Co., Ltd., was used, and in Comparative Example 4, a Cu powder having an average particle size of 0.3 μm, according to Patent Literature 2, was used.

Using the thus obtained solder paste, reflow soldering was performed in the following conditions. The reflow temperature was 250° C.
Evaluation of Joint Strength Using each solder paste, a chip resistor having 3216 size was mounted on a substrate by reflow soldering.

Using a joint strength tester STR-1000 manufactured by Rhesca Corporation, a shear strength of a joint portion between the chip resistor and the substrate was measured at two temperature conditions of a normal temperature (25° C.) and a high temperature (250° C.) to obtain a joint strength. The shear strength test conditions were: a shear speed was 6 mm per minute at the normal temperature, and 24 mm per minute at the high temperature; a test height was 100 μm at the normal temperature and the high temperature. The shear strength was measured 10 times per each solder paste, and an average value was calculated. In the test at the normal temperature, the paste having an average value of more than 20.0 N is evaluated as "acceptable," considering a case where a product on which the joint of the present invention is mounted. When the paste has the average value described above, the joint was not damaged by impacts, and the like. On the other hand, in the test at the high temperature, the paste having an average value of more than 0.0 N is evaluated as "acceptable," considering a production stage of electronic parts having the joint of the present invention. When the paste has the average value described above, the joint does not flow out in the second or subsequent reflow heating stage, or the parts mounted do not slide.

Evaluation of Temporal Stability

In this test, a static test and a dynamic test were performed to evaluate the temporal stability.

The static test is a test to evaluate the storage stability. Specifically, a solder powder, and a Cu powder or an intermetallic compound powder, and a substance in which a thixotropic agent is removed from a flux for a paste were put in a beaker, and the mixture was kneaded. After that, the produced sample was allowed to stand at 35° C. for 24 hours, and a color change of the appearance thereof was visually observed. A sample whose original color, yellow, was not changed or whose color was a little changed to yellowish green was evaluated as "O (good)" and a sample whose color was changed to green was evaluated as "X (poor)." This test is performed to confirm whether or not Cu ions, which affect the temporal stability, are eluted into the flux to generate copper rust.

In addition, an initial viscosity of each solder paste immediately after the production, and a viscosity with time of each solder paste which was stored in a refrigerator having a temperature of 0° C. to 10° C. for 6 months and then was returned to a normal temperature were measured by a PCU-205 apparatus, manufactured by Malcom Company Limited, and a change rate of the viscosity was calculated using a calculation formula: {(Viscosity with Time—Initial Viscosity)/Initial Viscosity×100}. A sample having a change rate of the viscosity which is within a range of ±15% from the initial viscosity was evaluated as "acceptable."

The dynamic test is a test to evaluate the temporal stability when actually using it by a continuous printability. Specifically, a produced solder paste was subjected to an at most 24 hour-stage with a printer, and a viscosity thereof was measured every 8 hours. A change rate of the viscosity was calculated in the same manner as in the static test, and a continuous printability was evaluated by a time at which the change rate of the viscosity is more than 15%. A testing apparatus was used the same apparatus as used in the static test.

The evaluation results in these evaluation tests are shown in Table 1. Each weight ratio shown in Table 1 is % by mass (wt %) relative to the solder paste.

As shown in Table 1, in the solder pastes in Examples, the color change of the flux was not observed at all, and thus it can be considered that Cu ions were not eluted to a degree in which the temporal stability was affected. All of the viscosity change, the storability and the continuous printability were stable, and thus it was found that the solder pastes of Examples had the excellent temporal stability.

The solder pastes showed a joint strength of 40 N or more at the normal temperature and 1.0 N or more at the high temperature, and it is found that the joint strength is improved over the conventional level.

On the other hand, the color of the flux in the solder pastes of Comparative Examples was changed to yellowish green, and thus it can be considered that a large amount of Cu ions were eluted. It was found that the solder pastes of Comparative Examples had the poor temporal stability. In Comparative Example 1, though the temporal stability can be secured, the joint strength of the solder joint cannot be kept at 250° C., because the amount of the intermetallic compound powder is small, 5%. In Comparative Example 2, the amount of intermetallic compound powder is large, 80%, and thus the amount of the Sn solder powder is small, resulting in the insufficient joining Comparative Example 3 is an example in which Cu powder is used, and the viscosity change is large. Comparative Example 4 is an example in which three components of the intermetallic compound powder, the Cu powder, and the solder powder are contained, the viscosity change is remarkable.

The invention claimed is:

1. A solder-joint-forming solder paste adapted for soldering of a substrate, the solder paste comprising:
  a metal powder component comprising:
    an intermetallic compound powder comprising $Cu_3Sn$; and
    a Sn-Bi solder powder containing, as a main component, Sn; and
  a flux component,
  wherein the metal powder component comprises 50 to 70% by mass of the intermetallic compound powder containing $Cu_3Sn$ and 30 to 50% by mass of the solder powder containing, as a main component, Sn,
  wherein the metal powder component has an average particle size of 50 μm or less, and
  wherein the solder powder has a Sn content of 40 to 100% by mass (excluding 100% by mass Sn).

TABLE 1

| | | Cu—Sn compound powder | | Cu powder | | Solder powder | | Joint strength (N) | | Storability | | |
|---|---|---|---|---|---|---|---|---|---|---|---|---|
| | | Composition [wt %] | Weight ratio [wt %] | Composition [wt %] | Weight ratio [wt %] | Composition [wt %] | Weight ratio [wt %] | 25° C. | 250° C. | Color | Viscosity change (%) | Continuous printability Viscosity change |
| Example | 1 | Cu—23Sn | 25 | — | 0 | Sn—3Ag—0.5Cu | 63 | 58.9 | 3.4 | o | 5.99 | 24 hours or more |
| | 2 | Cu—23Sn | 15 | — | 0 | Sn—3Ag—3.0Cu | 73 | 55.8 | 1.0 | o | 5.50 | 24 hours or more |
| | 3 | Cu—60Sn | 20 | — | 0 | Sn—3Ag—0.5Cu | 68 | 58.8 | 1.9 | o | 6.36 | 24 hours or more |
| | 4 | Cu—60Sn | 25 | — | 0 | Sn | 63 | 60.9 | 2.4 | o | 6.30 | 24 hours or more |
| | 5 | Cu—60Sn | 50 | — | — | Sn—3Ag—0.5Cu—0.02Ni | 38 | 48.9 | 2.8 | o | 6.10 | 24 hours or more |
| | 6 | Cu—23Sn | 60 | — | 0 | Sn—58Bi | 28 | 61.2 | 1.4 | o | 6.00 | 24 hours or more |
| Comparative Example | 1 | Cu—23Sn | 5 | — | 0 | Sn—3Ag—0.5Cu | 83 | 58.1 | 0.0 | o | 6.03 | 24 hours or more |
| | 2 | Cu—23Sn | 80 | — | 0 | Sn—3Ag—0.5Cu | 8 | 15.7 | 1.2 | o | 7.32 | 24 hours or more |
| | 3 | — | — | 100 | 25 | Sn—3Ag—0.5Cu | 63 | 30.4 | 0.9 | x | 16.16 | 8 hours to 16 hours |
| | 4 | Cu—68Sn | 29.85 | 100 | 0.15 | Sn | 50 | 55.4 | 0.0 | x | 50.00 | 8 hours or less |

* Only in Comparative Example 4, the test was performed using a Cu powder having a size of 0.3 μm.

2. The solder paste according to claim 1, wherein the solder powder is a mixture containing two or more kinds of solder powders having a composition different from each other.

3. A solder joint, which is formed on a substrate, wherein the solder joint is formed using the solder paste according to claim 2, and the solder joint contains a network structure comprising a second intermetallic compound.

4. The solder joint of claim 3, wherein the second intermetallic compound is formed by a reaction of the intermetallic compound comprising $Cu_3Sn$ with the Sn of the solder powder containing as a main component, Sn, and is formed between particles of the intermetallic compound comprising $Cu_3Sn$.

5. A solder joint according to claim 4, wherein the network structure of the second intermetallic compound comprises $Cu_6Sn_5$.

6. A solder joint, which is formed on a substrate, wherein the solder joint is formed using the solder paste according to claim 1, and the solder joint contains a network structure comprising a second intermetallic compound.

7. The solder joint of claim 6, wherein the second intermetallic compound is formed by a reaction of the intermetallic compound comprising $Cu_3Sn$ with the Sn of the solder powder containing as a main component, Sn, and is formed between particles of the intermetallic compound comprising $Cu_3Sn$.

8. A solder joint according to claim 7, wherein the network structure of the second intermetallic compound comprises $Cu_6Sn_5$.

* * * * *